(12) United States Patent
Peitzsch

(10) Patent No.: US 7,583,491 B2
(45) Date of Patent: Sep. 1, 2009

(54) ELECTROSTATIC CHUCK TO LIMIT PARTICLE DEPOSITS THEREON

(75) Inventor: Scott Peitzsch, Tewksbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/436,471

(22) Filed: May 18, 2006

(65) Prior Publication Data

US 2007/0268650 A1 Nov. 22, 2007

(51) Int. Cl.
*H01L 21/683* (2006.01)
(52) U.S. Cl. ...................................... 361/234
(58) Field of Classification Search ................. 361/234
See application file for complete search history.

(56) References Cited

U.S. PATENT DOCUMENTS

| | | | | |
|---|---|---|---|---|
| 4,759,917 A | * | 7/1988 | Coleman et al. | 423/87 |
| 5,479,006 A | * | 12/1995 | Schultz | 250/214 LA |
| 5,507,874 A | * | 4/1996 | Su et al. | 134/1 |
| 5,835,333 A | | 11/1998 | Castro et al. | |
| 6,153,524 A | * | 11/2000 | Henley et al. | 438/691 |
| 6,307,728 B1 | * | 10/2001 | Leeser | 361/234 |
| 6,333,246 B1 | * | 12/2001 | Narita et al. | 438/584 |
| 6,370,005 B1 | * | 4/2002 | Sun et al. | 361/234 |
| 6,507,029 B1 | * | 1/2003 | Nishimura et al. | 250/442.11 |

FOREIGN PATENT DOCUMENTS

| | | |
|---|---|---|
| EP | 1047125 A | 10/2000 |
| EP | 1096561 A | 5/2001 |

OTHER PUBLICATIONS

Ziegler, James F., Ion Implantation—Science and Technology 2004 Edition, 2004, p. 15-4, Ion Implantation Technology Co., Edgewater, Maryland, USA.

* cited by examiner

*Primary Examiner*—Stephen W Jackson
*Assistant Examiner*—Tien Mai

(57) ABSTRACT

An ion implanter includes an electrostatic chuck. The electrostatic chuck is configured to repel charged particles from a surface of the electrostatic chuck to limit deposits of the charged particles on the surface when the electrostatic chuck is not supporting any workpiece. An electrostatic chuck including a dielectric layer and at least one electrode is also provided. The at least one electrode is configured to accept a DC voltage signal to produce a first charge to repel charged particles from the dielectric layer when the dielectric layer is not supporting any workpiece to thereby limit deposits of the charged particles on the dielectric layer.

4 Claims, 4 Drawing Sheets

ELECTROSTATIC CHUCK TO LIMIT PARTICLE DEPOSITS THEREON

FIELD

This invention relates to electrostatic chucks, and, more particularly to electrostatic chucks to limit particle deposits thereon.

BACKGROUND

An electrostatic chuck may be utilized to secure a workpiece using electrostatic forces. The electrostatic chuck may be utilized in various systems such as in an ion implanter. In one instance, the ion implanter may be used to introduce conductivity-altering impurities into a workpiece such as a semiconductor wafer. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material to form a region of desired conductivity. The ion beam may be distributed over the wafer area by beam scanning, by wafer movement, or by a combination of beam scanning and wafer movement.

During different time interval the electrostatic chuck may not support any workpiece. An associated control system may sense this condition and cause translation of the electrostatic chuck to a parked position out of the ion beam's trajectory. When the electrostatic chuck is in this parked position, an ion beam may still be generated and directed at a beam stop. This may occur when an operator of the ion implanter runs tests such as extended beam stability tests. This may also occur during ion beam tuning procedures. For these and other reasons, particles may develop and form deposits on the electrostatic chuck when in the parked position. These deposits may adversely affect performance of the electrostatic chuck. For instance, the electrostatic chuck should provide sufficient clamping force to firmly clamp the workpiece to the electrostatic chuck and should be able to quickly clamp and release the workpiece to maintain throughput requirements. Such performance criteria may be adversely affected by particle deposits on the front surface of the electrostatic chuck leading to inconsistent and improper clamping and eventual failure of the electrostatic chuck.

One conventional solution to such particle deposits is to increase the frequency of cleaning of the electrostatic chuck. Drawbacks with this approach include the additional time and expense for such maintenance. In addition, the front surface of the electrostatic chuck may be made of fragile material which makes conventional cleaning methods difficult and may not result in acceptable electrostatic chuck performance even after conventional cleaning. Yet another conventional solution is to replace the entire electrostatic chuck. Drawbacks with this solution include the great expense of replacement in addition to the down time necessary to make such a replacement.

Accordingly, there is a need in the art for an electrostatic chuck to limit deposits thereon when the electrostatic chuck is not supporting any workpiece.

SUMMARY

According to a first aspect of the invention, an ion implanter is provided. The ion implanter includes an electrostatic chuck. The electrostatic chuck is configured to repel charged particles from a surface of the electrostatic chuck to limit deposits of the charged particles on the surface when the electrostatic chuck is not supporting any workpiece.

According to another aspect of the invention, a method is provided. The method includes clamping a workpiece to an electrostatic chuck of an ion implanter when the electrostatic chuck is supporting the workpiece, and repelling charged particles from a surface of the electrostatic chuck to limit deposits of the charged particles on the surface when the electrostatic chuck is not supporting any workpiece.

According to yet another aspect of the invention, an electrostatic chuck is provided. The electrostatic chuck includes a dielectric layer and at least one electrode. The at least one electrode is configured to accept a DC voltage signal to produce a first charge to repel charged particles from the dielectric layer when the dielectric layer is not supporting any workpiece to thereby limit deposits of the charged particles on the dielectric layer.

BRIEF DESCRIPTION OF THE DRAWINGS

For a better understanding of the present invention, reference is made to the accompanying drawings, which are incorporated herein by reference and in which.

DETAILED DESCRIPTION

The invention is described herein in connection with an ion implanter that utilizes an electrostatic chuck to support a workpiece. However, the invention can be used with other systems that utilize an electrostatic chuck to support a workpiece. Thus, the invention is not limited to the specific embodiments described below.

Figure 1:
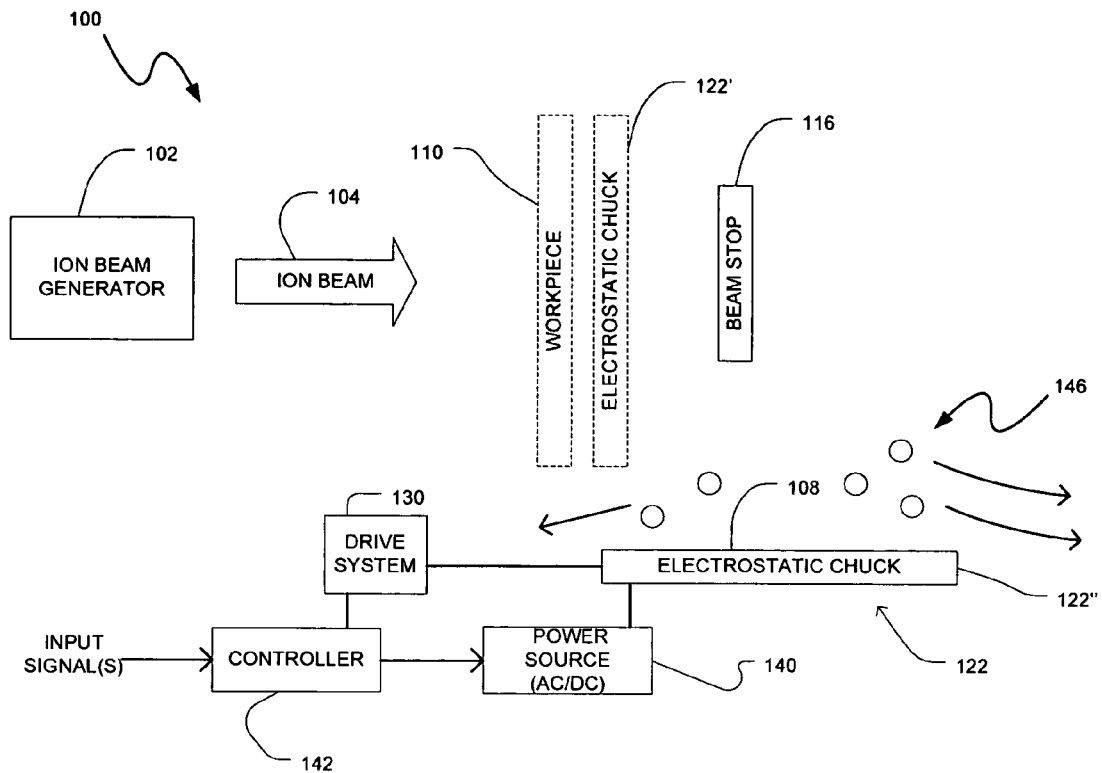
FIG. 1 is a schematic block diagram of an ion implanter including an electrostatic chuck consistent with the present invention.

FIG. 1 illustrates a block diagram of an ion implanter 100 including an ion beam generator 102 and an electrostatic chuck 122 consistent with an embodiment of the invention. The ion beam generator 102 can include various types of components and systems known in the art to generate the ion beam 104 having desired characteristics. The ion beam 104 may include, but not be limited to, a spot beam, a ribbon beam, or a scanned beam. The spot beam may have an irregular cross-sectional shape that in some instances may be approximately circular. The ribbon beam may have a large width/height aspect ratio and may be at least as wide as the workpiece 110. The scanned beam may be scanned in at least one direction by a scanner of the ion beam generator 102. The ion beam 104 can be any type of charged particle beam. Other ion implanters having an electrostatic chuck 122 may include a plasma doping system.

The electrostatic chuck 122 may support a workpiece 110. When the ion implanter 100 is utilized for semiconductor doping, the workpiece 110 may be a semiconductor wafer. The semiconductor wafer may be fabricated from any type of semiconductor material such as silicon or any other material that is to be implanted using the ion beam 104. The semiconductor wafer may have a common disk shape.

The electrostatic chuck 122 may be translated into different positions by a drive system 130. The drive system 130 may be controlled by a controller 142 depending on, at least, the presence of the workpiece 110. The drive system 130 may include servo drive motors, screw drive mechanisms, mechanical linkages, and any other components as are known in the art to drive the electrostatic chuck 122 in a desired way. The controller 142 can be or include a general-purpose computer or network of general-purpose computers that may be programmed to perform desired input/output functions. The controller 142 can also include other electronic circuitry or components, such as application specific integrated circuits, other hardwired or programmable electronic devices, discrete element circuits, etc. The controller 142 may also include communication, storage, and processing devices. The controller 142 may receive one or more input signals representative of different conditions of the ion implanter 100. One such input signal may be representative of the presence or absence of a workpiece. Another input signal may be representative of the presence or absence of the ion beam 104.

When the workpiece 110 is present it may be clamped to the electrostatic chuck 122 with electrostatic force. The drive system 130 may translate the electrostatic chuck 122 to an implanting position 122' shown in phantom. The workpiece 110 is also illustrated in phantom and separated from the electrostatic chuck 122 in its implanting position 122' for clarity of illustration although the workpiece 110 is securely clamped to the electrostatic chuck 122 during doping of the workpiece 110 with the ion beam 104.

When the electrostatic chuck 122 is not supporting any workpiece, the drive system 130 may translate the electrostatic chuck 122 to a parked position 122" outside of the trajectory of the ion beam 104. When the electrostatic chuck 122 is in the parked position 122", charged particles 146 may be present in the vicinity of the front surface 108 of the electrostatic chuck 122. Advantageously, the electrostatic chuck 122 is configured to repel the charged particles 146 from the surface 108 of the electrostatic chuck 122 to limit deposits of the charged particles on the surface 108 when the electrostatic chuck 122 is not supporting any workpiece.

The charged particles 146 may result from different sources. In some instances, the ion beam 104 may be directed at the beam stop 116 when no workpiece is present and the electrostatic chuck 122 is in the parked position 122". For instance, this may occur when an operator of the ion implanter runs tests such as extended beam stability tests, and during ion beam tuning procedures. One or more Faraday cups (not illustrated) as are know in the art may be included in the beam stop 116. Over time, the Faraday cups and other parts of the beam stop may become coated with a layer due to the ion beam 104. For example, an Arsenic layer may develop. Particles of this layer may then separate from the layer and float to an area within a vicinity of the front surface 108 of the electrostatic chuck 122. The Faraday cups may be fabricated of graphite and graphite grains may separate and provide another source of the charged particles 146. Yet another source of the charged particles 146 may result from the ion beam 104 striking a photoresist layer of the workpiece 110 during ion implantation. Hydrocarbons may then result and be present after implantation when the electrostatic chuck 122 is in the parked position 122".

To repel the charged particles 146 from the surface 108 of the electrostatic chuck 122 when the electrostatic chuck is not supporting any workpiece, the power source 140 in one embodiment may be configured to provide a DC voltage to the electrostatic chuck 122 to produce a first charge to repel like charged particles 146. In one instance, the first charge is a positive charge and the charged particles 146 have a positive charge.

Figure 2:
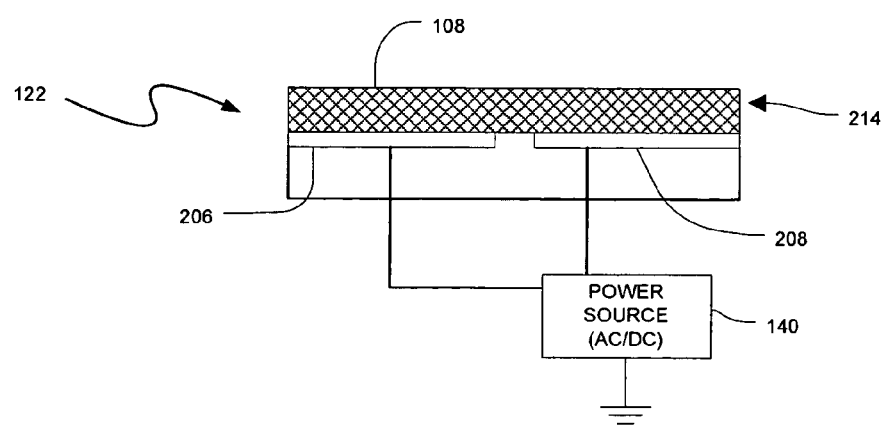
FIG. 2 is a schematic diagram of the electrostatic chuck of FIG. 1 in more detail.

Turning to FIG. 2, a schematic diagram of the electrostatic chuck 122 of FIG. 1 is illustrated in more detail. The electrostatic chuck 122 may include a dielectric layer 214, and at least one electrode such as electrodes 206, 208. The dielectric layer 214 may be fabricated of various insulator materials including, but not limited to, ceramic materials such as alumina. Although two electrodes 206, 208 are illustrated, the electrostatic chuck 122 may have only one electrode or more than two electrodes. The electrodes 206, 208 may be electrically connected to the power source 140 that supplies a voltage signal to each of the electrodes 206, 208.

Figure 3:
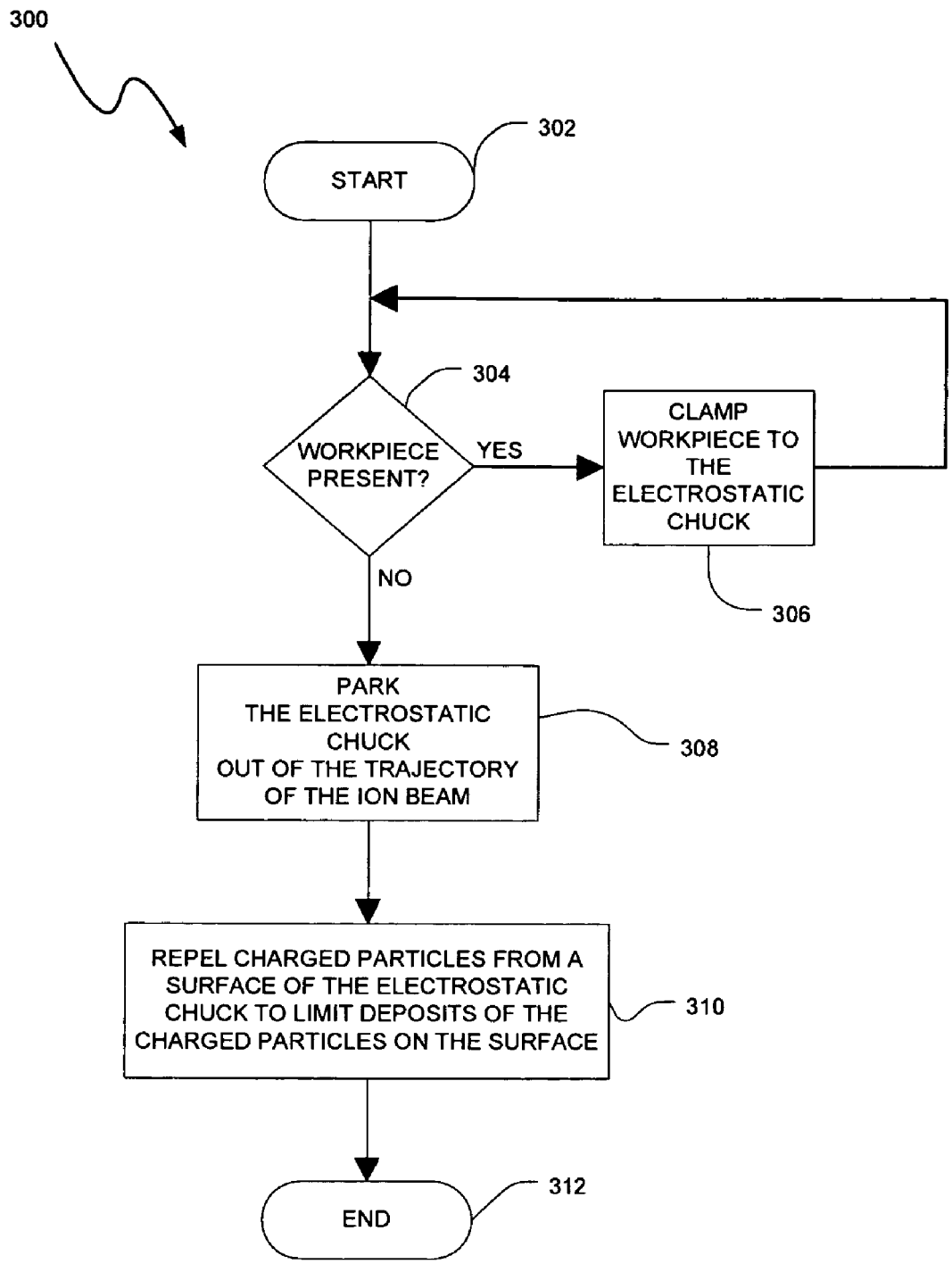
FIG. 3 is a flow chart of operations consistent with the invention.

Turning to FIG. 3, a flow chart of operations 300 consistent with the invention is illustrated. After the operations are started 302, it may be determined if a workpiece, e.g., workpiece 110, is present 304. If it is, the workpiece may be clamped to the electrostatic chuck 306. In one embodiment, the workpiece may be clamped to the electrostatic chuck 122 when the power source 140 provides a power signal to the electrodes 206, 208 to produce an electrostatic force to clamp the workpiece to the dielectric layer 214. The power signal may be an AC voltage signal. The electrostatic chuck may then be translated to the implanting position 122' for doping of the workpiece with the ion beam 104.

If a workpiece is not present, the electrostatic chuck may be parked in a parked position out of the trajectory of the ion beam 308. The electrostatic chuck is then advantageously configured to repel charged particles from a surface of the electrostatic chuck to limit deposits of the charged particles on the surface 310 and the process may end 312 until another workpiece is supplied for clamping to the electrostatic chuck. In one embodiment, the charged particles 146 may be repelled from a surface of the electrostatic chuck 122 when the power source 140 provides a DC voltage signal to the electrodes 206, 208 to produce a first charge to repel like charged particles 146.

In addition to the presence or absence of a workpiece, the controller 142 may selectively enable the electrostatic chuck to repel charged particles in response to one or more additional conditions. One condition may be the presence or absence of the ion beam 104 directed at the beam stop 116 when the electrostatic chuck is in the parked position 122". If the ion beam 104 is present, the controller 142 may enable the power source 140 to provide a DC voltage signal to produce the first charge to repel like charged particles. If the ion beam 104 is not present, this particle repulsion feature may be disabled by not providing a DC voltage signal to the electrostatic chuck 122.

Figure 4:
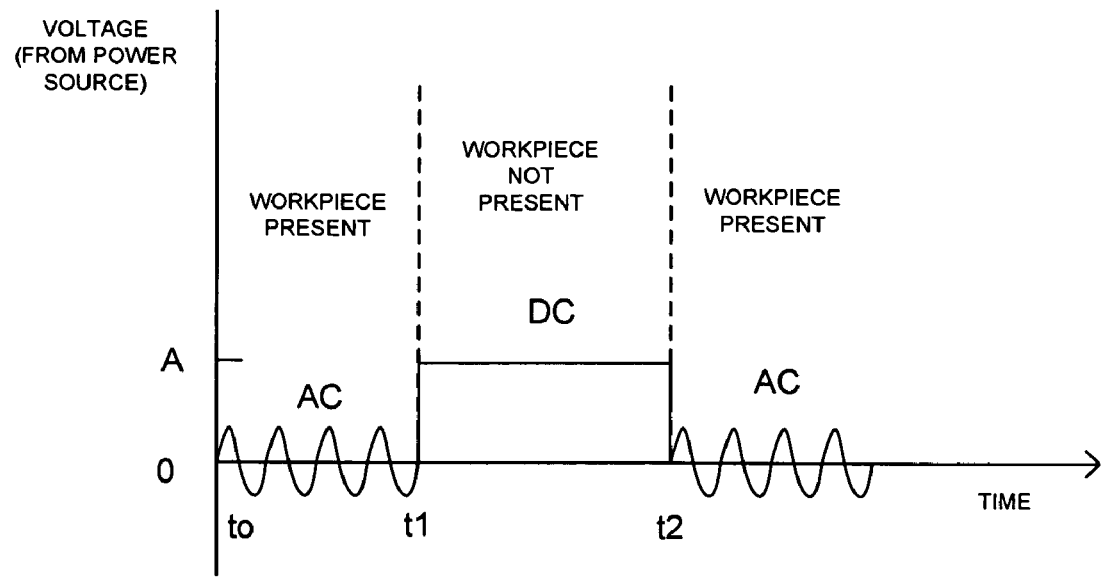
FIG. 4 is a plot of voltage versus time illustrating AC and DC voltage signals provided by the power source of FIG. 1 during different time intervals.

Turning to FIG. 4, a plot of voltage signals that may be provided by the power source 140 during differing time intervals are illustrated. During the time interval between times t0 and t1, a workpiece is present and an AC voltage signal may be provided by the power source 140 to the electrodes 206, 208 to produce an electrostatic force to clamp a workpiece to the electrostatic chuck 122.

During the time interval between times t1 and t2, a workpiece is not present and the electrostatic chuck 122 may be translated to the parked position 122". The power source 140 may then be configured to provide a DC voltage to the electrodes 206, 208 to produce a first charge to repel like charged particles 146 to limit deposits of the charged particles on the front surface 108 of the dielectric layer 214. In one instance, the amplitude A of the DC voltage signal may be about 1 kilovolt (kV) to produce a sufficient first charge to repel charged particles 146. In other instances, the amplitude A may be adjusted to provide for differing charge levels to repel differing charged particles 146. The amplitude A may be increased in response to an increased volume and/or weight of the charged particles 146.

During the time interval between times t2 and t3, another workpiece is present and the power source 140 may again provide an AC voltage to the electrodes 206, 208 during this time interval to produce an electrostatic force to clamp the workpiece to the electrostatic chuck 122. The AC voltage signal provided by the power source 140 to the electrodes for clamping may have differing amplitudes, frequencies, and waveforms.

Figure 5:
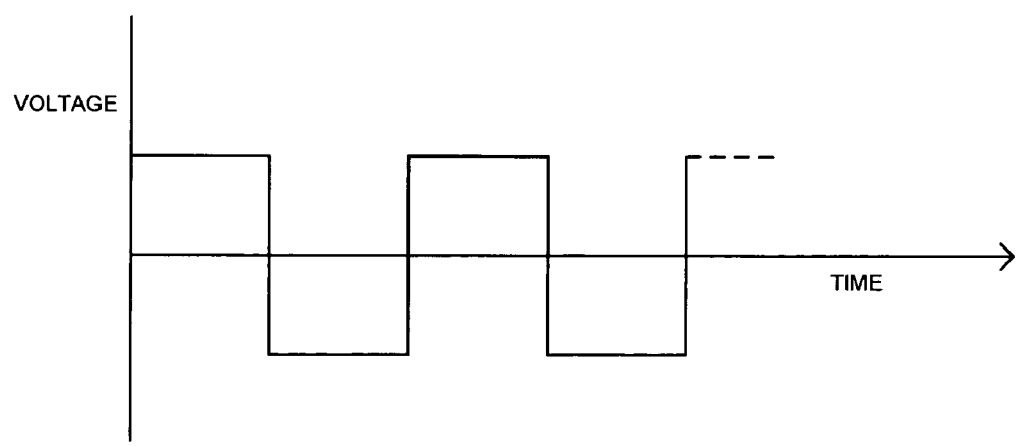
FIG. 5 is a plot of one exemplary AC voltage signal.

FIG. 5 illustrates a square wave AC voltage signal that may be applied to the electrodes 206, 208 during the clamping time intervals. The AC voltage signal may also have a sine wave form as illustrated in FIG. 4. Other AC voltage waveforms may also be provided by the power source 140 and the AC voltage is not limited to the square wave and sine wave waveforms illustrated. In addition, both FIGS. 4 and 5 illustrate only one AC phase for simplicity of illustration. It is to be understood, however, that a plurality of phases may be provided to different electrodes and hence different regions of the electrostatic chuck. In some instance, three phases 120 degrees apart may be applied to three electrodes and in other instances six phases 60 degrees apart may be applied to six electrodes.

In some embodiments, the dielectric layer 214 may have an even number of regions corresponding to an associated even number of electrodes. Differing AC voltages with differing phases may be applied to each electrode of each region so that at any one time there are an equal number of positively charged electrodes and negatively charged electrodes. Hence, the resulting net charge on the workpiece may be zero during clamping.

Figure 6:
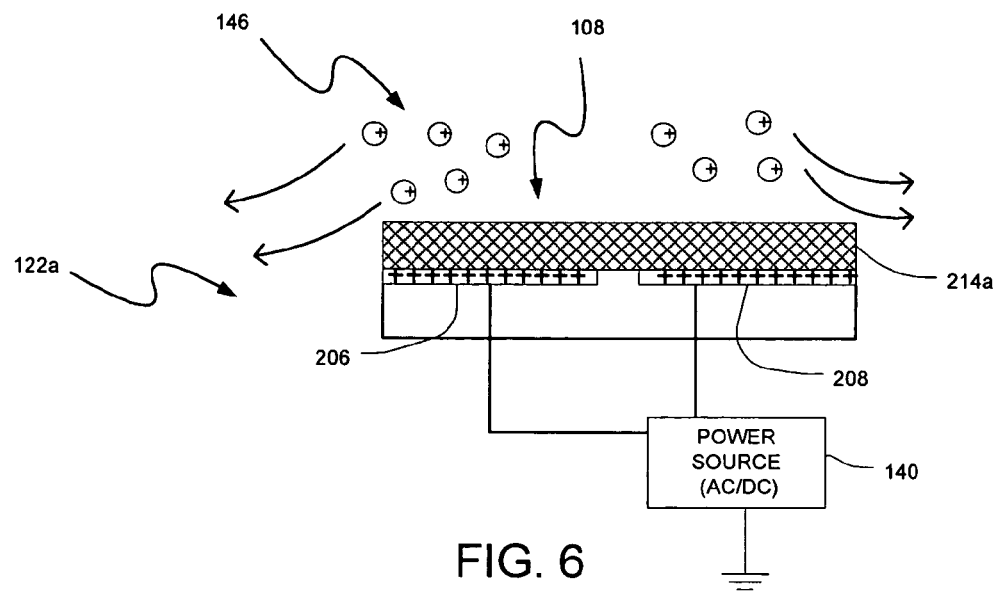
FIG. 6 is a schematic diagram of one embodiment of an electrostatic chuck where charge is prohibited from migrating through a dielectric layer.

Turning to FIG. 6, a schematic diagram of another embodiment 122a of an electrostatic chuck consistent with the electrostatic chuck 122 is illustrated. In this embodiment, the dielectric layer 214a of the electrostatic chuck 122a is configured to prohibit charge migration. This type of electrostatic chuck 122a may be referred to as a "Coulombic chuck." Therefore, when the power source 140 provides a DC voltage signal to the electrodes 206, 208, a first charge may be created on the electrodes 206, 208. The first charge may be a positive charge to repel charged particles 146 having a positive charge to limit deposits of the charged particles 146 on the surface 108 of the dielectric layer 214a.

Figure 7:
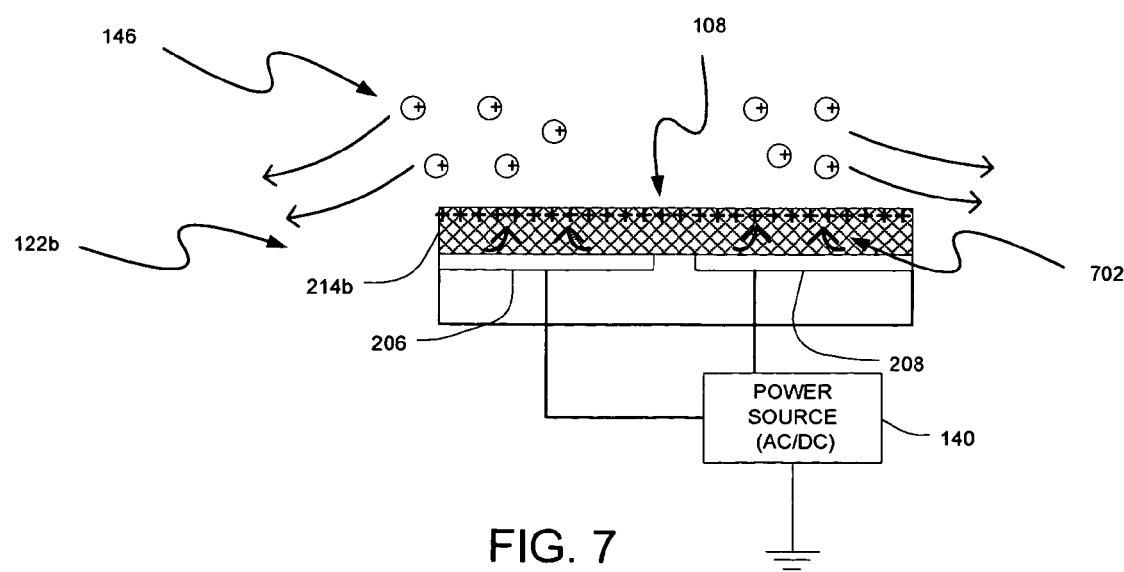
FIG. 7 is a schematic diagram of another embodiment of an electrostatic chuck where charge is allowed to migrate through a dielectric layer.

FIG. 7 is a schematic diagram of another embodiment 122b of an electrostatic chuck. In contrast to the embodiment of FIG. 6, the dielectric layer 214b of the embodiment of FIG. 7 is configured to allow charge migration through the dielectric layer 214b when DC voltage is applied to the electrodes 206, 208 as illustrated by arrows 702. This type of electrostatic chuck 122a may be referred to as a "Johnsen-Rahbek chuck." Therefore, when the power source 140 provides a DC voltage signal to the electrodes 206, 208, a first charge may migrate and flow as leakage current through the dielectric layer 214b as indicated by arrows 702. This leads to accumulation of the first charge at the surface 108 of the dielectric layer 214b. The first charge may be a positive charge to repel charged particles 146 also having a positive charge. Although illustrated as separate chucks in FIGS. 6 and 7, one electrostatic chuck may incorporate both Coulombic and Johnsen-Rahbek types in different regions.

The dielectric layers 214a and 214b of FIGS. 6 and 7 respectively may have a different dielectric property to either prohibit or allow charge migration there through. One dielectric property may be the volume resistivity of the dielectric layers 214a or 214b. The volume resistivity for the dielectric layer 214a of the Coulombic chuck 122a may be comparatively higher than the volume resistivity for the dielectric layer 214b of the Johnsen-Rahbek chuck 122b. In one example, the dielectric layer 214a may have a volume resistivity of about $10^{15}$ Ω-cm or greater to not permit any charge migration there through. In contrast, the dielectric layer 214b may have a volume resistivity less than about $10^{13}$ Ω-cm to permit charge migration through the dielectric layer 214b.

Advantageously, the electrostatic chuck is configured to repel charged particles to limit deposits of the charged particles on a surface of the electrostatic chuck when the electrostatic chuck is not supporting any workpiece. Accordingly, less preventative maintenance is necessary for the electrostatic chuck. Limiting deposits also helps to improve electrostatic chuck performance such as clamping pressure and clamp and release times that may otherwise be adversely affected by excessive particle deposits. In addition, costly electrostatic chuck replacements due to particle deposits can be delayed, if not avoided.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting.

What is claimed is:

1. A method comprising:
   clamping a workpiece to a surface of an electrostatic chuck of an ion implanter during a first time interval;
   implanting said workpiece with an ion beam during a portion of said first time interval;
   translating said electrostatic chuck out of a trajectory of said ion beam; and
   repelling positively charged particles from all of said surface of said electrostatic chuck with a positive first charge to limit deposits of said positively charged particles on said surface while said electrostatic chuck is not supporting any workpiece and while said ion beam is being directed at a Faraday cup during a second time interval only.

2. The method of claim 1, wherein said repelling of said positively charged particles comprises providing a DC voltage signal to at least one electrode of said electrostatic chuck to produce said first charge on said electrostatic chuck.

3. The method of claim 2, further comprising adjusting an amplitude of said DC voltage signal to adjust a magnitude of said first charge.

4. The method of claim 2, wherein said positively charged particles comprise Arsenic.

* * * * *